United States Patent [19]

Aoi et al.

[11] 4,249,219

[45] Feb. 3, 1981

[54] CURRENT DRIVE CIRCUIT FOR AN INDUCTION COIL

[75] Inventors: Hajime Aoi, Chofu; Takashi Tamura, Kokubunji; Makoto Koizumi, Hachioji; Noboru Kunimi, Sayama; Minoru Enomoto, Kodaira; Noriaki Hatanaka, Odawara, all of Japan

[73] Assignee: Hitachi, Ltd., Japan

[21] Appl. No.: 42,590

[22] Filed: May 24, 1979

[30] Foreign Application Priority Data

May 24, 1978 [JP] Japan .................................. 53/61056

[51] Int. Cl.³ .............................................. G11B 5/09
[52] U.S. Cl. .................................................... 360/46
[58] Field of Search .................................. 360/46, 61

[56] References Cited

U.S. PATENT DOCUMENTS

| | | | |
|---|---|---|---|
| 3,512,171 | 5/1970 | Hibner | 360/46 |
| 4,063,293 | 12/1977 | Perzhiz | 360/62 |

*Primary Examiner*—Vincent P. Canney
*Attorney, Agent, or Firm*—Craig & Antonelli

[57] ABSTRACT

A current drive circuit for an induction coil is provided comprising a clamp circuit connected to the two terminals of the coil. This clamp circuit prevents the voltages of the two terminals from dropping below a reference voltage, thereby preventing decreases of the amplifier constants $h_{FE}$ of the transistors which are also coupled to the two terminals for a read-out operation.

15 Claims, 1 Drawing Figure

CURRENT DRIVE CIRCUIT FOR AN INDUCTION COIL

BACKGROUND OF THE INVENTION

The present invention relates to a current drive circuit for a magnetic coil, and particularly to a circuit suitable for a magnetic memory.

The present invention can be applied to a circuit for driving a magnetic recording head, a step motor, an electric switch, a relay, and especially to a circuit for driving a magnetic recording head in a magnetic memory.

A magnetic head in a magnetic memory such as a magnetic disc memory or a magnetic tape memory has an induction coil wound around a magnetic core having a gap therein which is comprised of non-magnetic material. A magnetic head drive circuit drives the head and records digital signals in a magnetic recording medium. The circuit has means for applying a predetermined bias voltage to a center tap of the coil, a write circuit for switching the direction of the current flow through the coil in response to an input signal and a read circuit connected in parallel to the coil for reading signals stored in the recording medium. A magnetic memory has a plurality of magnetic heads and a plurality of write circuits and read circuits respectively connected to one of the magnetic heads. These write and read circuits are constructed by using integrated circuit technology. Each read circuit has a differential amplifier, which comprises a pair of transistors having directly connected emitters and a constant current source commonly connected to the emitters.

When the direction of the current flow through a coil is changed in order to record signals, a flyback voltage or in other words a counter electromotive force is induced in the coil and is applied to the bases of the pair of transistors of a corresponding read circuit. The breakdown voltage between the bases of the two transistors is equal to the sum of the forward voltage drop ($V_{BE}$) between the base and emitter of each transistor and the backward breakdown voltage ($V_{EBO}$) between the emitter and base of each transistor. When the above-mentioned counter electromotive force goes beyond the sum ($V_{BE}+V_{EBO}$), the grounded emitter amplifier constant $h_{FE}$ of the transistors of the read circuit drops. This results in lowering of the output level of the read circuit. The input resistance $R_A$ of the read circuit, the coil inductance, the coil capacitance and the input capacitance of the read circuit form a resonance circuit. If the amplifier constant $h_{FE}$ lowers, the input resistance $R_A$ lowers. If the resistance $R_A$ lowers, the damping of the resonant circuit increases and, therefore, a smaller amount of the read out voltage of the head is transferred to the read circuit near the resonance frequency. Thus, the output level of the read circuit drops.

LIST OF THE PRIOR ART

The following reference is cited to show the state of the art:
U.S. Pat. No. 3,763,383

SUMMARY OF THE INVENTION

An object of the present invention is, therefore, to provide a current drive circuit which can suppress the counter electromotive force induced in a coil.

Another object of the present invention is to provide a current drive circuit which can be constructed by the integrated circuit technology.

In order to achieve these and other objects, a current drive circuit according to the present invention comprises a clamp circuit which suppresses the counter electromotive force to less than the breakdown voltage of the read circuit.

BRIEF DESCRIPTION OF THE DRAWING

The FIGURE is a circuit diagram showing one embodiment of the present invention.

DESCRIPTION OF THE PREFERRED EMBODIMENTS

Figure 1:
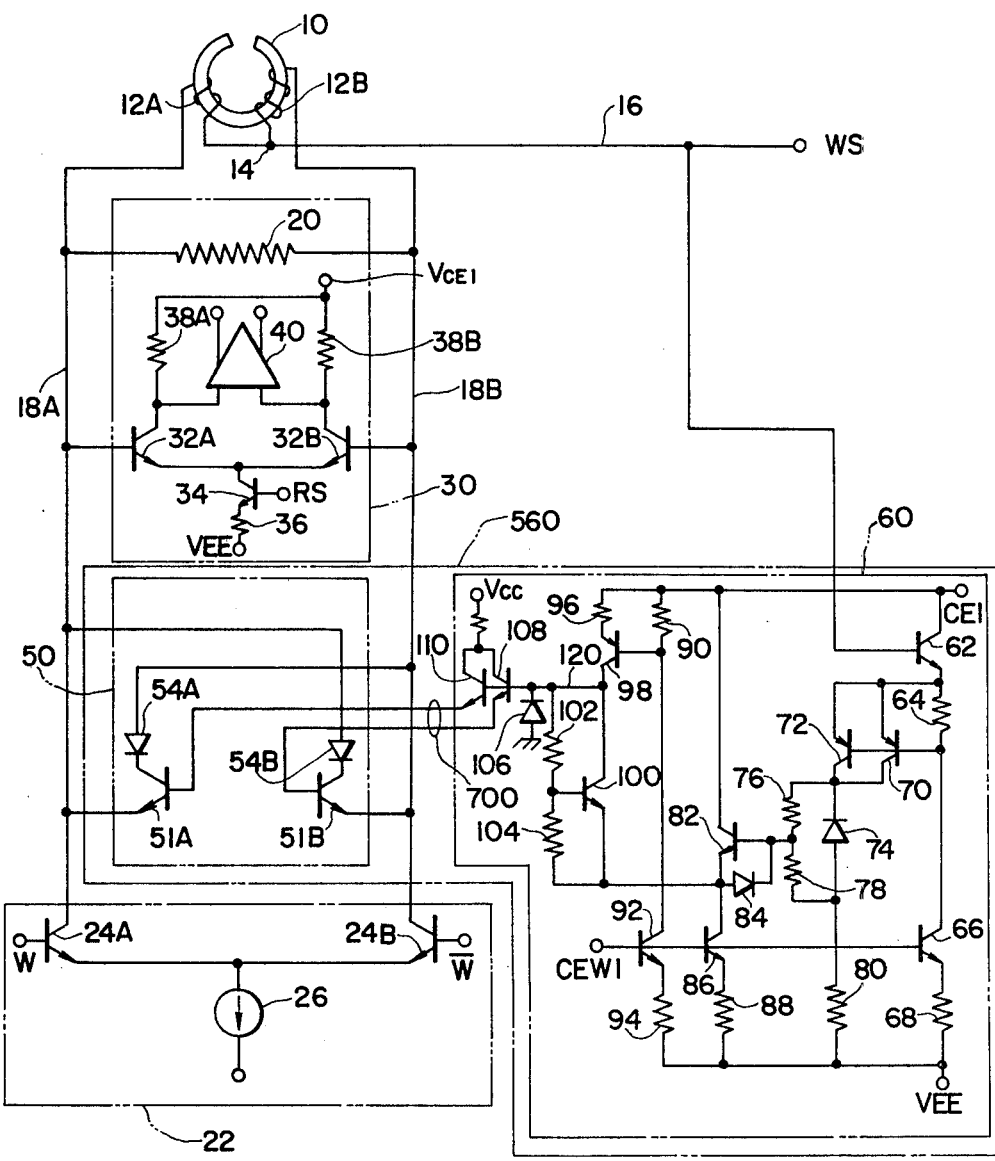

Referring to the FIGURE, a magnetic head comprises a circular magnetic core 10 and induction coils 12A and 12B wound therearound in the same direction. A respective one of the two terminals of the coils 12A and 12B is mutually connected at a center tap 14 and the other terminals of the coils are connected to a write circuit 22 by way of branches 18A and 18B, respectively. The write circuit 22 comprises a pair of transistors 24A and 24B with collectors respectively connected to the branches 18A and 18B and a constant current source 26 commonly connected to the emitters of the transistors 24A and 24B.

A read circuit 30 is also connected to the branches 18A and 18B. The read circuit 30 comprises a damping resistance 20 interposed between the branches 18A and 18B, transistors 32A and 32B with bases respectively connected to the branches 18A and 18B, a transistor 34 with a collector commonly connected to the emitters of the transistors 32A and 32B, a resistance 36 with a terminal connected to the emitter of the transistor 34, a voltage supply $V_{EE}$ which is equal to $-4$ volts and connected to the other terminal of the resistance 36, a pair of resistances 38A and 38B respectively connected to the collectors of the transistors 32A and 32B and a differential amplifier 40 connected to the collectors of the transistors 32A and 32B. The other terminals of the resistances 38A and 38B are connected to a voltage supply $V_{CE1}$ of 5.1 volts.

A signal is recorded in a magnetic recording medium (not shown) by generating a magnetic flux in the core 10 a direction of which changes depending on a signal to be recorded. A bias voltage signal WS which is set at a high level of 3.5 volts is provided to the center tap 14 by way of a line 16 from a bias voltage source (not shown). Signals W and $\overline{W}$ applied to the bases of the transistors 24A and 24B take either one of a high level of $-1$ volt or a low level of $-1.4$ volts on a selective basis depending on a signal to be recorded. A signal RS applied to the base of the transistor 34 is set at a low level of $-4$ volts in order to switch off the transistor 34. Thus, a current flows either from a terminal of the coil 12A or from a terminal of the coil 12B, depending on a signal to be recorded. Current flows through the coils 12A and 12B with different directions induce magnetic fluxes with different directions.

A signal recorded in the magnetic medium is read out as follows. The bias voltage signal WS is set at a low level of 0 volt and the current source 26 is switched off. The signal RS applied to the base of the transistor 34 is set at a high level of $-2.6$ volts and the transistor 34 is switched on. A constant current source which is formed of a transistor 34, a resistance 36 and a voltage source $V_{EE}$, provides a current to transistors 32A and 32B. A read signal is induced in the coils 12A and 12B and the polarity of the signal depends on the direction of the magnetic flux which intersects the gap of the core 10. Thus, the voltage of one of the branches 18A and 18B rises and the voltage of the other falls from the bias voltage of 0 volt. Thus, one of the transistors 32A and 32B which has a higher base voltage than that of the other transistor conducts, and a voltage drop across either one of the resistances 38A and 38B is detected by the differential amplifier 40.

A clamp circuit 560 is characteristic of the present invention and suppresses the counter electromotive forces induced in the coils 12A and 12B during a writing operation to a desirable value. The counter electromotive forces are induced when signals are recorded. The circuit 560 is decoupled from the branches 18A and 18B when signals are read out. If the voltage difference of the bases of the transistors 32A and 32B is too large, the grounded emitter amplifier constant $h_{FE}$ of the transistors 32A and 32B drops.

The clamp circuit 560 comprises a switch circuit 50 and a clamp voltage generating circuit 60. The circuit 60 generates a reference voltage of a typical value of 1.4 volts on a line 700. The circuit 50 comprises transistors 51A and 51B and diodes 54A and 54B. The reference voltage is supplied to the bases of the transistors 51A and 51B. The emitters of the transistors 51A and 51B are respectively connected to the branches 18A and 18B. The diode 54A is interposed between the branch 18B and the collector of the transistor 51A. The diode 54B is interposed between the branch 18A and the collector of the transistor 51B.

The operation of the circuit of the FIGURE will be now explained, as an example, when the signal $\overline{W}$ changes from $-1.4$ to $-1$ volts and the signal W changes from $-1$ to $-1.4$ volts. Under these conditions, the transistor 24A changes its state from off to on, and the transistor 24B changes its state from on to off. As a result, a current begins to flow along the branch 18A rapidly and the current which is flowing along the branch 18B begins to decrease rapidly. Therefore, due to these rapid changes of current flows through the coils 12A and 12B, counter electromotive forces are induced in the coils 12A and 12B. The counter electromagnetic force induced in the coil 12A reduces the voltage of the branch 18A to that less than 3.5 volts of the signal WS. The counter electromagnetic force induced in the coil 12B enhances the voltage of the branch 18B to that greater than 3.5 volts.

The transistor 51A conducts when the voltage of the branch 18A reaches a voltage of about 0.7 volts which is less than the base voltage (1.4 volts) of the transistor 51A by the forward voltage drop $V_{BE}$ (0.7 volts) between the emitter and base. As a result, the branch 18A is clamped at a voltage of 0.7 volts and will not drop below this level. In other words, the amplitude of the counter electromotive force induced in the coil 12A is limited to less than 2.8 volts.

As the coils 12A and 12B are tightly coupled, the amplitude of the counter electromotive force induced in the coil 12B is also limited to less than 2.8 volts. It is to be noted that the counter electromagnetic force induced in the coil 12B enhances the voltage of the branch 18B from 3.5 volts which is equal to the voltage of the signal WS to 6.3 volts.

Meanwhile, the current which is flowing through the transistor 24B along the line 18B just before the transistor 24B changes its state from an on-state to an off-state begins to flow through the diode 54A and the transistors 51A and 24A. The transistor 24A changes its state from an off-state to an on-state in response to the change of the state of the transistor 24B, and the transistor 51A is conductive due to the counter electromagnetic force, as explained above. Thus, the current which flows along the line 18B decreases rapidly. As a result, the decreasing rate of the current flow through the coil 12B is not slowed down so much in spite of the limiting of the counter electromotive force. Therefore, a high frequency of recording is still attained.

The maximum voltage difference between the branches 18A and 18B reaches 5.6 volts after switching of the transistors 24A and 24B. The breakdown voltage between the bases of the transistors 32A and 32B is equal to the sum of the forward voltage drop $V_{BE}$ of 0.7 volts between the emitter and base and the backward breakdown voltage $V_{EB0}$ of 5.6 volts between the emitter and the base. That is, the breakdown voltage between the two bases is equal to 6.3 volts, which is greater than the maximum voltage difference between the two branches 18A and 18B. Thus, the emitter grounded amplifier constants $h_{FE}$ of the transistors 32A and 32B are not lowered. By comparison, without limiting the voltage difference between two branches 18A and 18B, the voltage difference will reach 8 volts and the amplifier constants $h_{FE}$ of the transistors 32A and 32B will be lowered.

The explanation will be made of the operation of the clamp voltage generating circuit 60 when signals are recorded. During recording, signals CE1, WS and CEW1 are set at 5.1, 3.5 and $-2.6$ volts, respectively. A voltage source $V_{EE}$ is equal to $-4.0$ volts. Transistors 62 and 66 are conductive and the emitter voltage of the transistor 62 is equal to $(V_A - V_{BE})$ volts which is typically 2.8 volts, where $V_A$ represents the voltage of the signal WS, and $V_{BE}$ represents the forward voltage drop between the emitter and base of a transistor. A current flows from the emitter of the transistor 62 to the voltage source $V_{EE}$ by way of two parallelly-connected transistors 70 and 72, a diode 74 provided in a reverse direction and a resistance 80. The collector voltage of the transistor 70 is equal to $(V_A - V_{BE} - 0.1)$ volts which is equal to 2.7 volts. The voltage drop across the diode 74 is equal to the background breakdown voltage $V_{EB0}$ between an emitter and a base of a transistor. Two resistances 76 and 78 have the same resistance value. The voltage of the connecting point of the two resistors 76 and 78 is equal to $(V_A - V_{BE} - 0.1 - \frac{1}{2}V_{EB0})$ volts which is equal to $-0.1$ volts. Transistors 82 and 86 are in an on-state and a diode 84 is in an off-state when the signals CEW1 and CE1 are $-2.6$ and 5.1 volts, respectively and the base voltage of the transistor 82 is $-0.1$ volts. Hence, the emitter voltage of the transistor 82 is $(V_A - 2V_{BE} - 0.1 - \frac{1}{2}V_{EB0})$ volts which is equal to $-0.8$ volts. Under these conditions, transistors 92, 98 and 100 are all in an on-state. The transistor 100 and resistances 102 and 104 determine a voltage of a line 120 connected to the collector of the PNP transistor 98. The resistances 102 and 104 are set at 3.1 and 1 kΩ, respectively. The determined voltage is higher than the emitter voltage of the transistor 82 by 4.1 $V_{BE}$ volts, and is equal to $(V_A + 2.1 V_{BE} - 0.1 - \frac{1}{2}V_{EB0})$ volts which is equal to 2.1 volts. Hence, a diode 106 is not conductive.

When the voltage of the branch 18A reaches $(V_A + 0.1 V_{BE} - 0.1 - \frac{1}{2}V_{EB0})$ volts which is equal to 0.7 volts, the transistors 51A and 110 conduct and the voltage of the branch 18A does not become lower than about $(V_A - \frac{1}{2}V_{EB0})$ which is equal to 0.7 volts. In the same way, the branch 18B is clamped at a voltage of 0.7 volts because the transistors 51B and 108 conduct when the voltage of the branch 18B reaches $(V_A + 0.1 - V_{BE} - 0.1 - \frac{1}{2}V_{EB0})$ volts.

The maximum voltage difference between the two branches 18A and 18B is equal to $V_{EB0}$ volts. The breakdown voltage of the two transistors 32A and 32B is equal to $(V_{EB0} + V_{BE})$ volts. $V_{EB0}$ and $V_{BE}$ can vary within 0.25 and 0.02 volts from their typical values, respectively, due to process condition variation. Thus, the breakdown voltage $(V_{EB0} + V_{BE})$ can vary within 0.27 volts. It is clear, however, that the maximum voltage difference of $V_{EB0}$ volts of the two branches 18A and 18B cannot exceed the breakdown voltage $(V_{EB0} + V_{BE})$ in spite of the variation.

Thus, the circuit 60 can supply a reference voltage which prevents the lowering of the constant $h_{FE}$ in spite of the process variation.

It is to be noted, of course, that for some purposes the reference voltage may be set to be independent of $V_{EB0}$. A circuit for those purposes can be easily obtained by those skilled in the art.

During reading out, the clamp circuit 60 is decoupled from the branches 18A and 18B by setting the signals CE1, WS and CEW1 at 5.1, 0 and $-4.0$ volts respectively, Therefore, all of the transistors in the circuit 60 except the transistors 108 and 110 are in off-state. The voltage of the line 120 is clamped at a voltage of $-V_{BE}$. During recording operation, the line 120 is at a voltage of 2.1 volts. When the reading operation begins, the line 120 is connected to the voltage source $V_{EE}$ through the path comprising the resistances 102 and 104, a diode 84 and the resistances 78 and 80. The line 120 is then discharged rapidly through this path to the voltage of $-V_{BE}$ determined by the diode 106. Hence, the transistors 51A, 51B, 108A and 108B do not conduct unless the branches 18A and 18B are lowered to the voltage $-3V_{BE}$. In a conventional magnetic memory, the read signal is not so large as to lower the voltage of the branches 18A and 18B to such a low voltage. Thus, the circuit 560 is decoupled from the branches 18A and 18B during the reading operation.

It is to be noted that the current drive circuit according to the present invention can be constructed with conventional circuit elements. The diode 74 needs to operate in a reverse direction, but it may be a conventional diode because the current therethrough is a d.c. current as small as 1 mA. Therefore, the circuit according to the present invention can be realized by a master slice type integrated circuit.

While we have shown and described several embodiments in accordance with the present invention, it is understood that the same is not limited thereto but is susceptible to numerous changes and modifications as known to those skilled in the art and we therefore do not wish to be limited to the details shown and described herein but intend to cover all such changes and modifications as are encompassed by the scope of the appended claims.

We claim:

1. A current drive circuit for an induction coil comprising:
   current source means connected to said induction coil for providing a current thereto through first and second terminals of said induction coil on a selective basis;
   bias voltage source means coupled to the induction coil for providing a bias voltage thereto;
   means connected to said first and second terminals of said induction coil for responding to voltages of said first and second terminals;
   reference voltage means for providing a reference voltage;
   first switching means having a control electrode thereof connected to said reference voltage means, and an output electrode thereof being connected to said first terminal of said induction coil, wherein said first switching means conducts to supply said first terminal of said induction coil with a clamp voltage depending on said reference voltage when the difference between voltages of said control and output electrodes of said first switching means reaches a predetermined value; and
   second switching means having a control electrode thereof being connected to said reference voltage means, and an output electrode thereof being connected to said second terminal of said induction coil, wherein said second switching means conducts to supply said second terminal of said induction coil with said clamp voltage when the difference between voltages of said control and output electrodes of said second switching means reaches said predetermined voltage.

2. A current drive circuit according to claim 1 wherein:
   said first switching means has an input electrode connected to said second terminal of said induction coil, and allows a current flow between said input and output electrodes thereof when said first switching means conducts; and
   said second switching means has an input electrode connected to said first terminal of said induction coil, and allows a current flow between said input and output electrodes thereof when said second switching means conducts.

3. A current drive circuit according to claim 2 wherein:
   said first switching means comprises a first transistor, a collector thereof being connected to said second terminal of said induction coil, an emitter thereof being connected to said first terminal of said induction coil and a base thereof being connected to said reference voltage source means; and
   said second switching means comprises a second transistor, a collector thereof being connected to said first terminal of said induction coil, an emitter thereof being connected to said second terminal of said induction coil and a base thereof being connected to said reference voltage source means.

4. A current drive circuit according to claim 2 wherein said input electrodes of said first and second switching means are each connected to said second and first terminals of said induction coil through first and second unidirectional means, respectively, which allow unidirectional current flows from said second and first terminals of said induction coil to said output electrodes of said first and second switching means, respectively.

5. A current drive circuit according to claim 3 wherein:
   said collectors of said first and second transistors are connected to said second and first terminals of said induction coil by way of diodes, respectively.

6. A current drive circuit according to claim 3 wherein:
said reference voltage means comprises third and fourth transistors, emitters of which are connected to said bases of said first and second transistors, respectively.

7. A current drive circuit according to claim 1, 2, 3, 4, 5 or 6 wherein:
said means for responding to said voltages of said first and second terminals comprises a pair of transistors whose bases are respectively connected to said first and second terminals of said induction coil and whose emitters are mutually coupled, and wherein said reference voltage means provides said reference voltage which changes in proportion to half of a breakdown voltage between an emitter and a base of each of said pair of transistors.

8. A current drive circuit according to claim 1, 2, 3, 4, 5, or 6 wherein:
said reference voltage means is connected to said bias voltage means and provides said reference voltage depending on the level of said bias voltage.

9. A current drive circuit according to claim 7 wherein:
said reference voltage means is connected to said bias voltage means and provides said reference voltage depending on the level of said bias voltage.

10. A current drive circuit according to claim 1 wherein said bias voltage source is coupled to said induction coil through a center tap of said induction coil.

11. A current drive circuit for an induction coil for writing and reading information into and from a magnetic memory comprising:
writing means including current source means connected to said induction coil for providing a current thereto through first and second terminals of said induction coil on a selective basis;
bias voltage source means connected to said induction coil for providing bias voltage thereto;
reading means connected to said first and second terminals of said induction coil for responding to voltages at said first and second terminals;
reference voltage means for providing a reference voltage;
first switching means having a control electrode thereof being connected to said reference voltage means, and an output electrode thereof being connected to said first terminal of said induction coil, wherein said first switching means conducts to supply said first terminal of said induction coil with a clamp voltage depending on said reference voltage when the difference between voltages of said control and output electrodes of said first switching means reaches a predetermined value; and
second switching means having a control electrode thereof being connected to said reference voltage means, and an output electrode thereof being connected to said second terminal of said induction coil, wherein said second switching means conducts to supply said second terminal of said induction coil with said clamp voltage when the difference between voltages of said control and output electrodes of said second switching means reaches said predetermined voltage,
wherein the voltage level clamped at said first and second terminals is below a breakdown voltage of said reading means to prevent breakdown of said reading means when information is being written into the magnetic memory by said writing means.

12. A current drive circuit according to claim 11 wherein said writing means comprises a first transistor having a collector-emitter path coupled between the first terminal of the induction coil and the current source, and a second transistor having a collector-emitter path coupled between the second terminal of the induction coil and the current source.

13. A current drive circuit according to claim 11 or 12 wherein:
said reading means comprises a pair of transistors whose bases are respectively connected to said first and second terminals of said induction coil and whose emitters are mutually coupled, and wherein said reference voltage means provides said reference voltage which changes in proportion to half of a breakdown voltage between an emitter and a base of each of said pair of transistors.

14. A current drive circuit according to claim 11 or 12 further comprising means to render said first and second switching means non-conductive when the reading means is reading information from the magnetic memory.

15. A current drive circuit according to claim 13 further comprising means to render said first and second switching means non-conductive when the reading means is reading information from the magnetic memory.

* * * * *